United States Patent
Tan et al.

(10) Patent No.: US 7,517,726 B1
(45) Date of Patent: Apr. 14, 2009

(54) WIRE BONDED CHIP SCALE PACKAGE FABRICATION METHODS

(75) Inventors: Xiaochun Tan, Shanghai (CN); Jun Guo, Shanghai (CN)

(73) Assignee: Shanghai KaiHong Technology Co., Ltd (CN)

( * ) Notice: Subject to any disclaimer, the term of this patent is extended or adjusted under 35 U.S.C. 154(b) by 0 days.

(21) Appl. No.: 12/109,617

(22) Filed: Apr. 25, 2008

(51) Int. Cl.
*H01L 21/00* (2006.01)

(52) U.S. Cl. .................. 438/114; 438/113; 438/106; 438/110; 438/127; 438/462; 438/465; 257/678; 257/723; 257/787; 257/788; 257/795; 257/789

(58) Field of Classification Search .......... 438/106, 438/110, 113, 114, 126, 127, 462, 465, 612; 257/678, 723, 778, 787, 788, 790, 789, 795
See application file for complete search history.

(56) References Cited

U.S. PATENT DOCUMENTS

| | | | |
|---|---|---|---|
| 5,817,541 A | 10/1998 | Averkiou et al. | |
| 6,107,164 A * | 8/2000 | Ohuchi | 438/465 |
| 6,420,244 B2 | 7/2002 | Lee | |
| 6,498,392 B2 * | 12/2002 | Azuma | 257/676 |
| 6,613,694 B2 * | 9/2003 | Ohuchi et al. | 438/759 |
| 6,732,913 B2 | 5/2004 | Alvarez | |
| 6,770,543 B2 * | 8/2004 | Nakamura | 438/460 |
| 2003/0155641 A1 | 8/2003 | Yeo et al. | |
| 2008/0014677 A1 | 1/2008 | Xiaochun et al. | |

* cited by examiner

*Primary Examiner*—Phuc T Dang
*Assistant Examiner*—Thanh Y Tran
(74) *Attorney, Agent, or Firm*—Chad R. Walsh; Fountainhead Law Group P.C.

(57) ABSTRACT

In one embodiment the present invention includes a method of manufacturing a chip scale package. Embodiments of the present invention include sawing kerfs between semiconductor device boundaries on opposite sides of the wafer and filling the kerfs with mold compound. The devices may then be sawed into individual packaged devices encapsulated in mold compound. In one embodiment, kerfs on opposite sides of the wafer have different widths to create a step in the wafer boundary with the mold compound, which improves the integrity of the package. In one embodiment, a device and one or more neighboring devices are bonded together using bond wires to form a group of device that are encapsulated in mold compound.

20 Claims, 3 Drawing Sheets

WIRE BONDED CHIP SCALE PACKAGE FABRICATION METHODS

CROSS REFERENCE TO RELATED APPLICATIONS

The present application claims priority to Chinese Patent Application No. 200810033895.3, filed Feb. 26, 2008, naming Xiaochun Tan and Jun Guo as inventors.

BACKGROUND

The present invention relates to semiconductor package assembly processes, and in particular, to chip scale package assembly methods.

As society progresses, there is a desire for smaller and thinner devices. One method of shrinking the electrical devices is to create more complex semiconductor chips that take up less real estate in the electronic device. Shrinking the semiconductor packaging may also help to achieve that goal. Traditional semiconductor packages have used a metal lead frame that provides electrical connections to the printed circuit board outside the package. The size of the traditional package is limited by the size of the lead frame.

The desire for miniaturization has pushed the development of advanced packaging methods such as chip scale packages (CSP). CSPs allow for a smaller package outline and footprint. Instead of using a lead frame like traditional semiconductor packages, a CSP uses metallization to generate contact pads of the semiconductor die for contact. Furthermore, the chip is generally encapsulated within a mold compound to protect the chip from the environment and prevent it from flexing. This allows the semiconductor chip package size to be close in size to semiconductor die itself. The reduction of packaging size allows for higher integration of electronics and therefore enables more enhanced functionality and allows for a reduction in overall size of the electronic device.

However, as compared to traditional packaging methods, the disadvantage of CSP is its higher manufacturing cost. Present chip scale package assembly methods require advanced processing techniques and special die layout in order to manufacture such products. Furthermore, current techniques may not sufficiently protect the semiconductor package unit from damage created by exposures to the environment such as damage by moisture, thereby reducing the service life of the package unit.

Thus, there is a need for improved package assembly methods. The present invention solves these and other problems by providing chip scale package assembly methods.

SUMMARY

Embodiments of the present invention improve chip scale package manufacturing. In one embodiment the present invention includes a method of manufacturing a chip scale package. Embodiments of the present invention include sawing kerfs between semiconductor device boundaries on opposite sides of the wafer and filling the kerfs with mold compound. The devices may then be sawed into individual packaged devices encapsulated in mold compound. In one embodiment, kerfs on opposite sides of the wafer have different widths to create a step in the wafer boundary with the mold compound, which improves the integrity of the package. In one embodiment, a device and one or more neighboring devices are bonded together using bond wires to form a group of device that are encapsulated in mold compound.

In one embodiment, the present invention includes a method of fabricating a chip scale package (CSP), the method comprising the steps of receiving a wafer having a plurality of semiconductor devices and a plurality of boundaries separating the semiconductor devices, each semiconductor device having at least one bonding pad, sawing the front of the wafer at a first boundary to establish a first kerf wherein the first kerf does not extend through the back of the wafer, coupling a bonding wire from a bonding pad on the front of a first semiconductor device to a bonding pad on the front of a neighboring semiconductor device, wherein a plurality of said first semiconductor devices and corresponding neighboring semiconductor devices form a plurality of semiconductor device groups, molding the front of the wafer with a non-conductive mold compound wherein the mold compound fills the first kerf and protects the bonding wire, sawing the back of the wafer at the first boundary to establish a second kerf opposite to the first kerf wherein the depth of the second kerf, molding the back of the wafer with a non-conductive mold compound wherein the mold compound fills the second kerf, grinding the back of the wafer to expose a plurality of bonding pads, plating the plurality of exposed bonding pads with a conductive material, and sawing the boundary around the semiconductor device groups to form a plurality of packaged devices, wherein a packaged device includes a first semiconductor device and one or more neighboring semiconductor devices coupled by one or more bonding wires.

In another embodiment, the present invention includes a method of fabricating a chip scale package (CSP), the method comprising the steps of receiving a wafer having a plurality of semiconductor devices and a plurality of boundaries separating the semiconductor devices, each semiconductor device having at least one bonding pad, grinding the back of the wafer to establish a desired die height, sawing the back of the wafer at a first boundary to establish a first kerf wherein the first kerf does not extend through the front of the wafer, plating the back of the wafer with a conductive material, sawing the front of the wafer at the first boundary to establish a second kerf wherein the second kerf does not extend through the back of the wafer, coupling a bonding wire from a bonding pad on the front of a first semiconductor device to a bonding pad on the front of a neighboring semiconductor device, wherein a plurality of said first semiconductor devices and corresponding neighboring semiconductor devices form a plurality of semiconductor device groups, molding the front of the wafer with a non-conductive mold compound wherein the mold compound fills the second kerf, sawing the back of the wafer to establish a third kerf wherein contacts the mold compound in the second kerf, molding a non-conductive mold compound into the third kerf in the back of the wafer, and sawing the boundary around the semiconductor device groups to form a plurality of packaged devices wherein a packaged device includes a first semiconductor device and one or more neighboring semiconductor devices coupled by one or more bonding wires.

In one embodiment, an active terminal of the first semiconductor device is coupled a first bonding pad on a first surface of the silicon wafer and one or more other active terminals of the first semiconductor device are on an opposite surface of the wafer and coupled to one or more bonding pads on the first surface through one or more neighboring semiconductor devices. One or more neighboring semiconductor devices may be conductive paths (plugs) through the wafer.

The following detailed description and accompanying drawings provide a better understanding of the nature and advantages of the present invention.

DETAILED DESCRIPTION

Described herein are techniques for performing chip scale package assembly methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
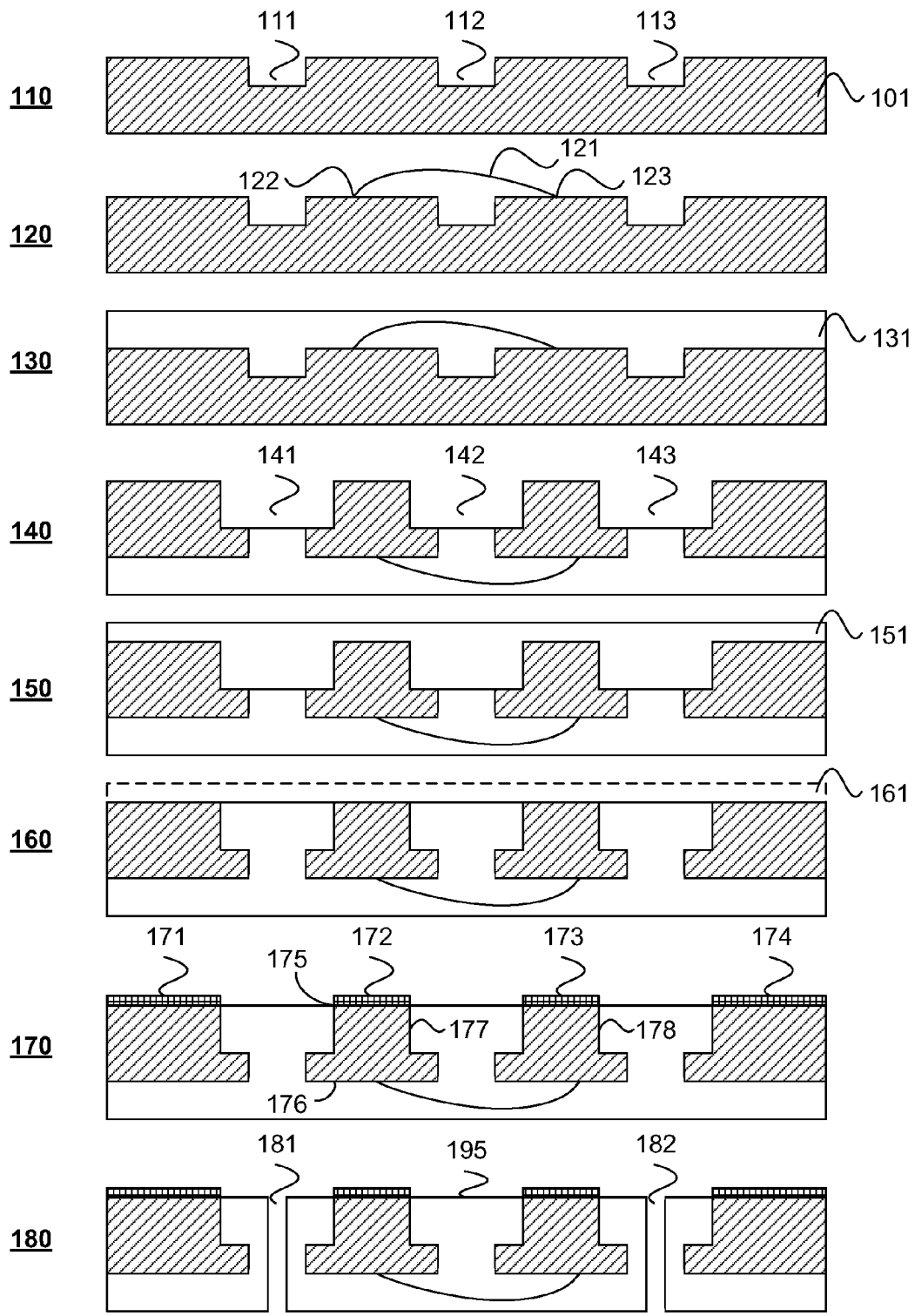
FIG. 1 illustrates a method of fabricating a chip scale package according to one embodiment of the present invention.

FIG. 1 illustrates a method of fabricating a chip scale package according to one embodiment of the present invention. Chip scale packages are generated from a wafer having a plurality of circuits and a plurality of boundaries separating the circuits. Each circuit has a plurality of bonding pads for coupling to other circuits or external devices. In this embodiment, circuits on wafer 101 may be coupled to neighboring circuits and separated into individual packaged devices. The method in FIG. 1 includes the steps of first sawing 110, wire bonding 120, first molding 130, second sawing 140, second molding 150, back grinding 160, metal plating 170, and singulation sawing 180.

First sawing step 110 comprises sawing into the front side of the wafer for generating a plurality of first kerfs. A kerf, as the term is used herein, refers to an area of evacuated semiconductor material in the wafer, a cut in the wafer, for example, or the depth and width of the trench created by the sawing of the wafer. Kerfs may also have other shapes than cross-sectional rectangles (e.g., cross-sectional triangles or V-shapes). Kerfs 111 through 113 may be created by first sawing step 110. In one embodiment, the first kerfs all consist of the same depth and width, wherein the depth does not extend through the back of the wafer. These kerfs may be located within the boundaries separating the circuits. In one example, the location or dimensions of the first kerfs are controlled by a surface depth control method. For example, using a typical saw machine control method, the saw blade contacts a chuck table to test the sawing height. However, each wafer had the tolerance or variation in thickness, for example, which causes that cut height to have a corresponding tolerance. Embodiments of the present invention may use the surface height control method, where the cut height may be measured from the wafer surface. For example, the measured height may be used to update the OS (Operation System) and sawing hardware to improve the accuracy of the cut. Similarly, the location and width of the cut may be controlled using this method.

Wire bonding step 120 comprises bonding a wire between two neighboring circuits on the wafer. The bonding wire may be gold, copper, or another conductive material, for example. One end of bonding wire 121 may be coupled to bonding pad 122 on the front side of a first circuit and the other end of bonding wire 121 may be coupled to bonding pad 123 on the front side of a neighboring circuit. Wire bond at 122 may be a ball bond, for example, and wire bond at 121 may be a wedge bond, for example. In one embodiment, conductive bumps (e.g., solder bumps) may be added to the bonding pads prior to attaching the bonding wire. This may assist in attaching the bonding wire to the bonding pads. For example, a bonding pad may include the addition of conductive bumps prior to coupling with the conductive bonding wire. In one exemplary embodiment, addition of the conductive bumps and the bonding of the wire may be performed by a machine capable of both actions.

First molding step 130 comprises adding mold compound 131 to the front of the wafer. The mold compound may be a non-conductive material that fills in the first kerfs and encapsulates the bonding wire. For example, in one embodiment a powder or liquid based molding compound may be used. Additionally, the filler size of the compound may be less than 30 um. Further, a small filler size can make the compound surface flat and improve the properties of the package. Advantages of doing so may include protecting the front of the wafer from the environment, thereby limiting damage from moisture or other contaminants. Furthermore, encapsulation of the bonding wire may protect it from damage.

Second sawing step 140 comprises sawing into the back side of the wafer for generating a plurality of second kerfs. In this embodiment, second kerfs 141 through 143 are generated in this step. The second kerfs may all consist of the same depth and width, wherein the depth of the second kerf is less than the depth of the wafer. Furthermore, the second kerfs may be located at a boundary between two circuits. In one embodiment, the second kerfs are placed in a location where they overlap the first kerfs from the front of the wafer. If the second kerfs are deep enough, this may allow the second kerf to come in contact with the first kerf. In one example, the combined depth of the second kerf and the first kerf is at least the depth of the wafer and the location of the second kerf is overlapping the first kerf, thereby allowing the second kerf to reach molding compound 131 in molding step 130. This may completely remove a portion of the boundary that physically connected the circuits. In one embodiment, a surface depth control method controls the depth of the second kerf depending on the location and dimensions of the first kerf. This may require the surface depth control method to detect the topology of the front of the wafer, thereby detecting the location and dimensions of the first kerf. In one example, this is done through an infrared camera.

Second molding step 150 comprises adding mold compound 151 to the back of the wafer. In one embodiment, mold compound 151 is a non-conductive material. The mold compound may fill the second kerfs. Advantages of filling the second kerfs may include protecting the sides of the circuits that are exposed due to the second kerfs from the environment. Depending on the depth of the second kerf, mold compound 151 may come in contact with mold compound 131, thereby completely filling a portion of the boundary between two neighboring circuits with mold compound. In one embodiment, the mold compound extends past the second kerfs and covers the back of the wafer, thereby surrounding all sides of the individual circuits with mold compound.

Back grinding step 160 comprises removing a portion from the back of the wafer (e.g., the mold compound 151). In one embodiment, back grinding may remove a uniform portion of material from the back of the wafer, wherein the uniform portion removed exposes a plurality of bonding pads belonging to the circuits. This may include grinding away section 161 of molding compound 151 until the silicon layer on the bonding pads belonging to the circuits is revealed.

Metal plating step 170 comprises adding metal to the bonding pads exposed in step 160 for connecting to an external device. The metal may be a Ni—Au, Ni—Co alloy, for example. In one embodiment, the metal plating is added to a bonding pad made of the device surface (e.g. silicon), thereby creating a conductive surface. For example, in one embodiment, one device 177 in a bonded device pair is a diode with a cathode 175 and an anode 176. The other device 178 may be a conductive region (e.g., doped silicon have a low ohmic characteristic) that couples the anode of device 177 to the silicon surface for contact. Accordingly, the cathode of device 177 may be electrically coupled through a bonding pad to metal layer 172 and the anode may be electrically coupled through bonding wire, conductive device 178, and a bonding pad to metal layer 173. This may be done in preparation for connecting the devices to a printed circuit board ("PCB"), for example. Depending on the circuit's tolerance to heat (e.g., the diode), the plating temperature may need to be monitored and controlled during this step so that the circuits in the devices are not adversely affected by the plating process. In this embodiment, metal plating 171 through 174 are added to the exposed bonding pads of wafer 101.

The above example illustrates one example diode implementation where a diode device of N-type material results in the cathode connected to metal pad 172 and the anode coupled through the second device to another pad. However, it is to be understood that a diode device of P-type material which would result in the anode connected to metal terminal 172 and the cathode coupled through the second device to another pad. Additionally, a bipolar transistor structure may be implemented wherein there are two conductive devices (or plugs) per active device and two bondwires, where a source is coupled directly to a pad, one bondwire couples to a base, and the other bondwire couples to an emitter. In another embodiment, a MOSFET structure may be implemented, wherein there are two conductive plugs per device and two bondwires, where a drain is coupled directly to a pad, one bondwire couples to a gate, and the other bondwire couples to a source. It can be seen that any combination of the above may be used for single devices or more complex circuits, wherein one active terminal of a circuit (e.g., a base, emitter, collector, drain, gate, source, anode, or cathode, or electrically active substrate) is coupled to a surface of a silicon wafer (e.g., the active terminal is manufactured under or near either the back or front at a pad) and one or more other active terminals are manufactured on the opposite surface of the wafer and coupled to one or more neighboring devices (e.g., adjacent devices on the wafer), which form conductive paths through the wafer. For example, other embodiments may include a six terminal device of two BJT's, a six terminal device of one BJT and one MOSFET, or a five terminal device with one diode, and one BJT, and a variety of other more complex circuits.

Singulation sawing step 180 comprises sawing at boundaries between the circuits to form a plurality of packaged devices. In one embodiment, singulation sawing through molding compound 131 and 151 may generate individual packaged pairs of devices comprising neighboring circuits pairs that are connected internally by a bonding wire. These packaged devices may be completely surrounded by molding compound 131 and 151, except for the metal plated bonding pads that are necessary for coupling to external devices. In this example, separating circuits at points 181 and 182 creates pairs of packaged device 195, which comprises two circuits coupled by a bonding wire. The packaged devices may then be handled and attached to external devices.

Figure 2A:
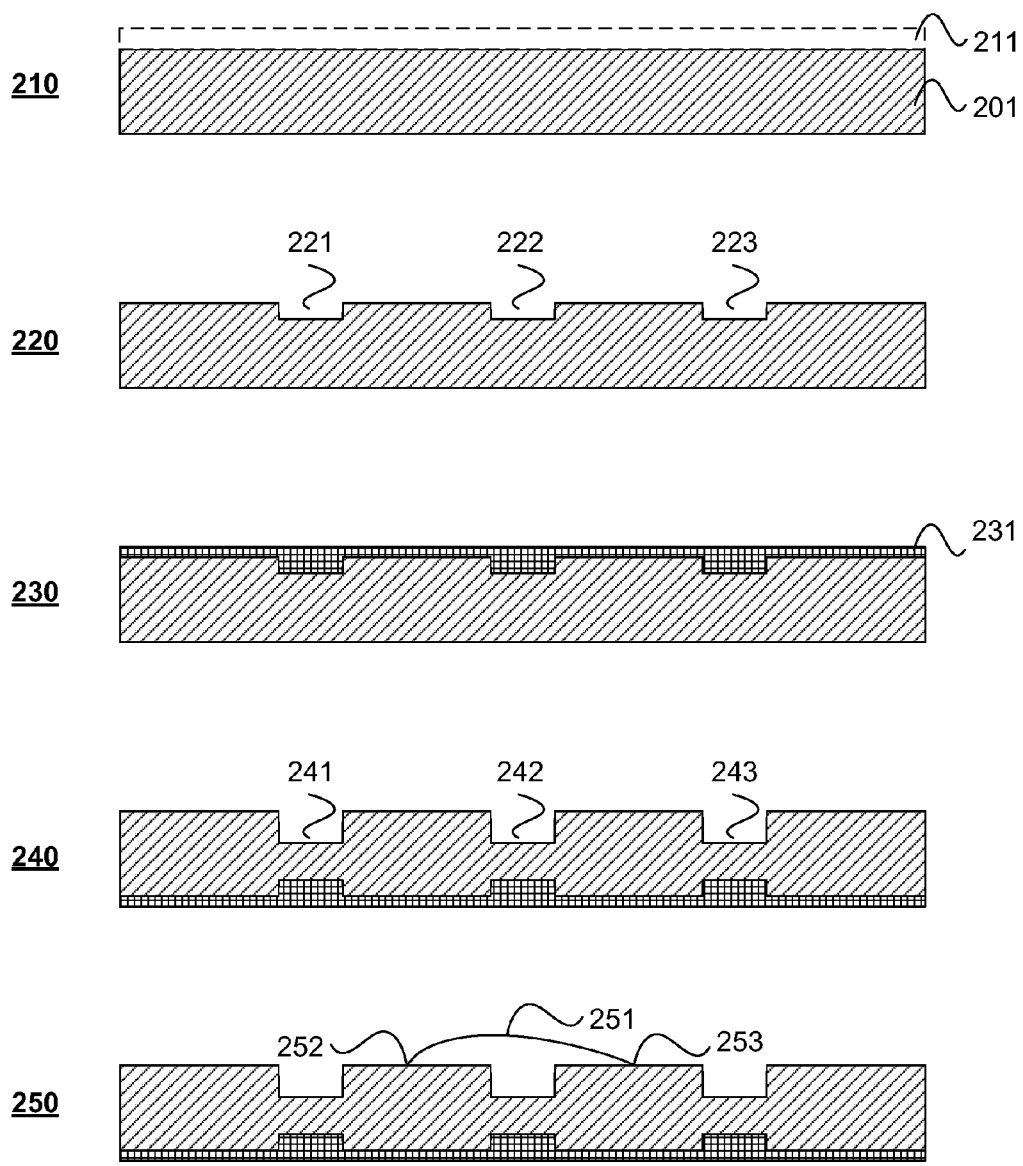
FIG. 2 illustrates a method of fabricating a chip scale package according to another embodiment of the present invention.
Figure 2B:
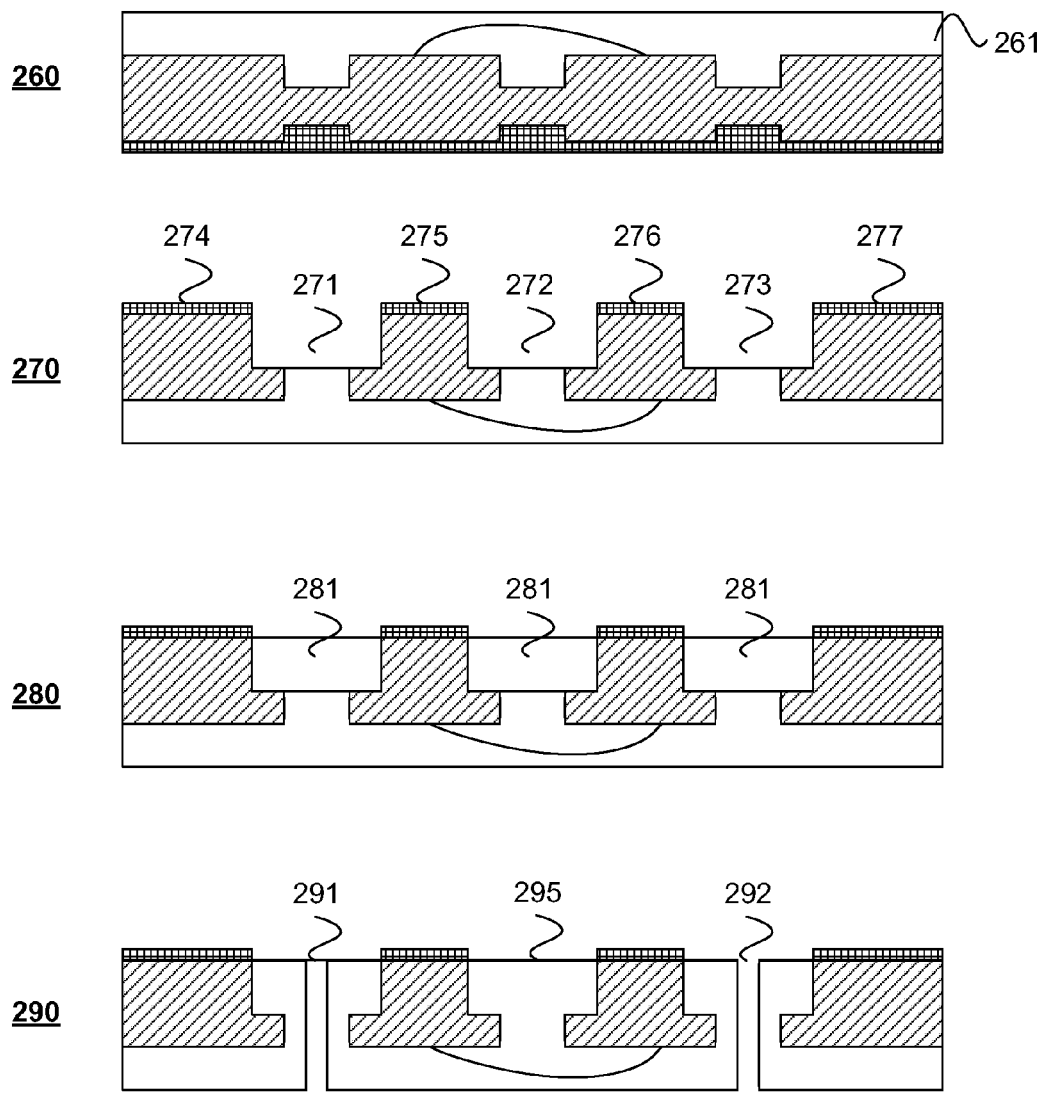

FIG. 2 illustrates a method of fabricating a chip scale package according to another embodiment of the present invention. The method includes the steps of back grinding 210, first sawing 220, adding back metal 230, second sawing 240, wire bonding 250, first molding 260, third sawing 270, second molding 280, and singulation sawing 290. The method has been separated into FIGS. 2a and 2b wherein the step 250 is followed by step 260.

Back grinding step 210 comprises removing a portion from the back of the wafer. In this embodiment, portion 211 is removed from wafer 201 via back grinding. In one embodiment, removing the portion from the back of the wafer may establish a desired die height.

First sawing step 220 comprises sawing into the back side of the wafer for generating plurality of first kerfs. This step may help the machine recognize the kerf track on the metal surface for further processing steps. In one embodiment, the first kerfs all consist of the same depth and width, wherein the depth does not extend through the back of the wafer. These kerfs may be located within the boundaries separating the circuits. In one example, the location or dimensions of the first kerfs are controlled by a surface depth control method. The surface depth control method may require knowledge of the topology of the front of the wafer. In one example, this is done through an infrared camera. In this embodiment, first sawing step generates kerfs 221 through 223, wherein the kerfs are located in the boundaries between the circuits.

Adding back metal step 230 comprises adding metal to the back of the wafer. In one embodiment, the metal plating is added to a non-conductive wafer for generating a wafer with a conductive back side. This may allow the back of the wafer, including existing bonding pads, to be conductive. Depending on the circuit's tolerance to heat, the plating temperature may need to be monitored and controlled during this step. In this embodiment, metal plating 231 may be added to the back of non-conductive wafer 201. The back of the wafer may include bonding pads. Therefore, application of the back metal may create conductive bonding pads. This may be done in preparation for connecting the bonding pads to a printed circuit board ("PCB"). Depending on the circuit's tolerance to heat, the plating temperature may need to be monitored and controlled during this step.

Second sawing step 240 comprises sawing into the front side of the wafer for generating a plurality of second kerfs on the front of the wafer. In this embodiment, second sawing step generates second kerfs 241 through 243. The location of the second kerfs may be positioned in the boundaries between the circuits. The dimensions of the second kerfs may all be the same depth and width. In one embodiment, the dimensions of the second kerfs are dependant to the width of the boundary and the front side of the wafer. The width of the boundary may place an upper limit on the width of the second kerfs to prevent damage to the circuits. The depth of second kerfs may depend on the topology of the front side of the wafer. For example, the depth of the second kerfs may be calculated to prevent contact with first kerfs 221 through 223 or back metal 231, thereby leaving a section of wafer 201 intact between second kerfs 241 through 143 and first kerfs 221 through 223. The location and dimensions of the second kerfs may be controlled by a surface depth control system, which may utilize infrared technology as described above.

Wire bonding step 250 comprises bonding a wire between two neighboring circuits on the wafer. In this embodiment, bonding wire 251 may be coupled to bonding pad 252 on the front side of a first circuit and bonding pad 253 on the front side of a neighboring circuit. In one embodiment, it may be advantageous to add bumps to the bonding pads prior to attaching the bonding wire. This may create a conductive surface on the bonding pad for the bonding wire to attach to and also improve adhesion to the bonding pad. In one exemplary embodiment, addition of the conductive bumps and the bonding of the wire may be performed by a machine capable of both actions.

First molding step 260 comprises adding mold compound 261 to the front of the wafer. In one embodiment, mold compound 261 is a non-conductive material. The mold compound may fill in the second kerfs and encapsulate the bonding wire. This may coat the front of the wafer to protect it from the environment and encapsulate the bonding wire to protect it from damage. Since the material is non-conductive, the circuits on the wafer may retain their original functionality.

Third sawing step 270 comprises sawing into the back side of the wafer for generating a plurality of third kerfs. The third kerfs may be located in the boundaries between the circuits and contain a uniform depth and width. In one embodiment, the depth and width of the third kerfs are limited to the width of the boundary and the front side of the wafer, respectively. The depth of the third kerfs may be controlled by a surface depth control system. In one embodiment, the surface depth control system may use infrared to determine the depth of the second kerfs located on the front said of the wafer. Once the depth of the second kerfs is determined, the desired depth of the third kerfs may be calculated by subtracting the depth of the second kerfs from the depth of the wafer. This may allow the third kerfs to come into contact with molding compound 261. In this embodiment, third kerfs 271 through 273 are generated from this step. This may include removal of first kerfs 221 through 223 filled with metal backing 231, thereby leaving metal backing only on bonding pads 274 through 277 located on the back of the wafer.

Second molding step 280 comprises adding mold compound to the front of the wafer. In this embodiment, this may include adding mold compound 281 to third kerfs 271 through 273 generated from step 270. Similar to mold compound 261, mold compound 281 may be a non-conductive material that protects the third kerfs from the environment. This may protect the sides of the circuits in wafer 201 from the environment when they are cut into separate dies. Furthermore, contact between the third kerf and the second kerf may allow the combination of mold compound 261 and 281 to completely fill a channel from the front of the wafer to the back of the wafer, wherein the channel is located at a boundary between two neighboring circuits. This may serve as a prime location to separate the circuits into individual dies. In one embodiment, mold compound 281 may not encapsulate bonding pads 274 through 277, thereby leaving the bonding pads ready to be attached to a printed circuit board ("PCB").

Singulation sawing step 290 comprises sawing at boundaries between the circuits to form a plurality of packaged devices. In this embodiment, sawing through the wafer at 291 and 292 may generate packaged device 295. Packaged device 295 may be completely surrounded by molding compound 261 and 281, except for the metal plated bonding pads 275 and 276 that are necessary for coupling to external devices. The packaged devices may then be handled and attached to external devices.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method of fabricating a chip scale package (CSP), the method comprising the steps of:
   receiving a wafer having a plurality of semiconductor devices and a plurality of boundaries separating the semiconductor devices, each semiconductor device having at least one bonding pad;
   sawing the front of the wafer at a first boundary to establish a first kerf wherein the first kerf does not extend through the back of the wafer;
   coupling a bonding wire from a bonding pad on the front of a first semiconductor device to a bonding pad on the front of a neighboring semiconductor device, wherein a plurality of said first semiconductor devices and corresponding neighboring semiconductor devices form a plurality of semiconductor device groups;
   molding the front of the wafer with a non-conductive mold compound wherein the mold compound fills the first kerf and protects the bonding wire;
   sawing the back of the wafer at the first boundary to establish a second kerf opposite to the first kerf wherein the depth of the second kerf;
   molding the back of the wafer with a non-conductive mold compound wherein the mold compound fills the second kerf;
   grinding the back of the wafer to expose a plurality of bonding pads;
   plating the plurality of exposed bonding pads with a conductive material; and
   sawing the boundary around the semiconductor device groups to form a plurality of packaged devices, wherein a packaged device includes a first semiconductor device and one or more neighboring semiconductor devices coupled by one or more bonding wires.

2. The method of claim 1 wherein the bonding wire is entirely encapsulated within the mold compound.

3. The method of claim 1 wherein coupling a bonding wire includes adding conductive bumps to the bonding pad on the front of the first semiconductor device and the bonding pad on the front of the neighboring semiconductor device.

4. The method of claim 1 wherein the location and dimensions of the first kerf is detected while the front side of the wafer is not directly accessible.

5. The method of claim 1 wherein the combined depth of the first kerf and the second kerf is at least the depth of the wafer.

6. The method of claim 1 wherein the width of the first kerf is less than the width of the second kerf.

7. The method of claim 1 wherein the conductive material is metal.

8. The method of claim 1 wherein an active terminal of the first semiconductor device is coupled a first bonding pad on a first surface of the silicon wafer and one or more other active terminals of the first semiconductor device are on an opposite surface of the wafer and coupled to one or more bonding pads on the first surface through one or more neighboring semiconductor devices.

9. A method of fabricating a chip scale package (CSP), the method comprising the steps of:
   receiving a wafer having a plurality of semiconductor devices and a plurality of boundaries separating the semiconductor devices, each semiconductor device having at least one bonding pad;

grinding the back of the wafer to establish a desired die height;

sawing the back of the wafer at a first boundary to establish a first kerf wherein the first kerf does not extend through the front of the wafer;

plating the back of the wafer with a conductive material;

sawing the front of the wafer at the first boundary to establish a second kerf wherein the second kerf does not extend through the back of the wafer;

coupling a bonding wire from a bonding pad on the front of a first semiconductor device to a bonding pad on the front of a neighboring semiconductor device, wherein a plurality of said first semiconductor devices and corresponding neighboring semiconductor devices form a plurality of semiconductor device groups;

molding the front of the wafer with a non-conductive mold compound wherein the mold compound fills the second kerf;

sawing the back of the wafer to establish a third kerf wherein contacts the mold compound in the second kerf;

molding a non-conductive mold compound into the third kerf in the back of the wafer; and sawing the boundary around the semiconductor device groups to form a plurality of packaged devices wherein a packaged device includes a first semiconductor device and one or more neighboring semiconductor devices coupled by one or more bonding wires.

10. The method of claim 9 wherein the bonding wire is encapsulated within the mold compound.

11. The method of claim 9 wherein the plating step fills the first kerf and covers the entire wafer.

12. The method of claim 9 wherein the step of molding the third kerf fills the third kerf without covering the metal plating.

13. The method of claim 9 wherein the width of the third kerf is greater than the width of the first kerf.

14. The method of claim 9 wherein the depth of the third kerf is greater than the depth of the first kerf.

15. The method of claim 9 wherein the third kerf completely removes the first kerf.

16. The method of claim 9 wherein the width of the third kerf is greater than the width of the second kerf.

17. The method of claim 9 wherein coupling a bonding wire includes adding bumps to a plurality of bonding pads on the wafer and coupling the bonding wire to the bumps.

18. The method of claim 9 wherein the location and dimensions of the second kerf is detected while the front side of the wafer is not directly accessible.

19. The method of claim 9 wherein the combined depth of the second kerf and the third kerf is at least the depth of the wafer.

20. The method of claim 9 wherein an active terminal of the first semiconductor device is coupled a first bonding pad on a first surface of the silicon wafer and one or more other active terminals of the first semiconductor device are on an opposite surface of the wafer and coupled to one or more bonding pads on the first surface through one or more neighboring semiconductor devices.

* * * * *